United States Patent
Chowdhury et al.

(10) Patent No.: US 8,941,189 B2
(45) Date of Patent: Jan. 27, 2015

(54) FIN-SHAPED FIELD EFFECT TRANSISTOR (FINFET) STRUCTURES HAVING MULTIPLE THRESHOLD VOLTAGES (VT) AND METHOD OF FORMING

(71) Applicant: International Business Machines Corporation, Armonk, NY (US)

(72) Inventors: Murshed M. Chowdhury, Newburgh, NY (US); Benjamin R. Cipriany, Wappingers Falls, NY (US); Brian J. Greene, Wappingers Falls, NY (US); Arvind Kumar, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 13/735,227

(22) Filed: Jan. 7, 2013

(65) Prior Publication Data

US 2014/0191325 A1 Jul. 10, 2014

(51) Int. Cl.
*H01L 29/78* (2006.01)
*H01L 27/092* (2006.01)
*H01L 21/8238* (2006.01)

(52) U.S. Cl.
CPC .... *H01L 27/0924* (2013.01); *H01L 21/823821* (2013.01)
USPC .................................. 257/401; 257/E29.264

(58) Field of Classification Search
USPC ........................................................ 257/366
See application file for complete search history.

(56) References Cited

U.S. PATENT DOCUMENTS

| 7,214,991 | B2 * | 5/2007 | Yeo et al. ....................... 257/401 |
| 7,301,210 | B2 | 11/2007 | Abadeer et al. |
| 7,547,947 | B2 * | 6/2009 | Anderson et al. ............. 257/369 |
| 7,611,980 | B2 | 11/2009 | Wells et al. |
| 7,829,951 | B2 * | 11/2010 | Song et al. ..................... 257/365 |
| 8,148,052 | B2 | 4/2012 | Vanleenhove et al. |
| 2003/0151074 | A1 | 8/2003 | Zheng et al. |
| 2009/0026543 | A1 | 1/2009 | Yang |

OTHER PUBLICATIONS

Hasan et al., "Dual-Metal-Gate Work Function by Controlling Metal Gate Thickness and Composition", Electrochemical and Solid State Letters, 11 (5), H124-H126, 2008.
Choi et al, "Growth Mechanism of ALD-TiN and the Thickness Dependence of Work Function", IEEE 2005.

* cited by examiner

*Primary Examiner* — Chandra Chaudhari
(74) *Attorney, Agent, or Firm* — H. Daniel Schnurmann; Hoffman Warnick LLC (57) ABSTRACT

Various embodiments include fin-shaped field effect transistor (finFET) structures that enhance work function and threshold voltage (Vt) control, along with methods of forming such structures. The finFET structures can include a p-type field effect transistor (PFET) and an n-type field effect transistor (NFET). In some embodiments, the PFET has fins separated by a first distance and the NFET has fins separated by a second distance, where the first distance and the second distance are distinct from one another. In some embodiments, the PFET or the NFET include fins that are separated from one another by non-uniform distances. In some embodiments, the PFET or the NFET include adjacent fins that are separated by distinct distances at their source and drain regions.

18 Claims, 8 Drawing Sheets

FIN-SHAPED FIELD EFFECT TRANSISTOR (FINFET) STRUCTURES HAVING MULTIPLE THRESHOLD VOLTAGES (VT) AND METHOD OF FORMING

FIELD OF THE INVENTION

The subject matter disclosed herein relates to integrated circuits. More particularly, the subject matter relates to fin-shaped field effect transistors, also known as finFETs.

BACKGROUND

As integrated circuit devices advance to technology nodes at ever-smaller sizes, various components within these devices have also become smaller. Additionally, spacing between these components has decreased, creating challenges in layout formation and device optimization.

One integrated circuit device where shrinking dimensions play a role is the fin-shaped field effect transistor (also referred to as a finFET). The conventional finFET is a three-dimensional transistor structure that includes a set (e.g., one or more) of fin-shaped (relatively thin) source and drain regions overlying a substrate, and at least one (relatively thick) gate overlying the fin(s). The channel region in this finFET spans between the source and drain in the thin fin, beneath the gate. In one particular type of finFET, known as the replacement gate (RG) finFET, the fin (source-drain region) is formed prior to the gate.

It is known in the art that modifying a threshold voltage (Vt) of an integrated circuit device can enhance performance characteristics of that device. Conventional approaches for modifying a threshold voltage in finFET devices, e.g., RG finFETS, involve doping portions of the device to enhance channel mobility, or modifying the length of the channel region. Both of these approaches involve process steps such as masking, lithography and etching, which can complicate fabrication and consume time and resources.

SUMMARY

Various embodiments described include fin-shaped field effect transistors (finFETS). In some cases, a fin-shaped field effect transistor structure (finFET) includes: a substrate having a first portion and a second portion separated by an isolation region; a p-type field effect transistor region (PFET) over the first portion, the PFET including: a plurality of PFET metal fins over the first portion of the substrate, the plurality of PFET fins having a first PFET fin, a second PFET fin adjacent the first fin, and a third PFET fin adjacent the second fin, wherein the first PFET fin is separated from the second PFET by a first distance, and the second PFET fin is separated from the third PFET fin by the first distance; and an n-type field effect transistor region (NFET) over the second portion, the NFET including: a plurality of NFET metal fins over the first portion of the substrate, the plurality of NFET fins having a first NFET fin, a second NFET fin adjacent the first fin, and a third NFET fin adjacent the second fin, wherein the first NFET fin is separated from the second NFET by a second distance, and the second NFET fin is separated from the third NFET fin by the second distance, wherein the second distance is distinct from the first distance.

A first aspect of the invention includes a fin-shaped field effect transistor structure (finFET) structure includes: a substrate having a first portion and a second portion separated by an isolation region; a p-type field effect transistor region (PFET) over the first portion, the PFET including: a plurality of PFET metal fins over the first portion of the substrate, the plurality of PFET fins having a first PFET fin, a second PFET fin adjacent the first fin, and a third PFET fin adjacent the second fin, wherein the first PFET fin is separated from the second PFET by a first distance, and the second PFET fin is separated from the third PFET fin by the first distance; and an n-type field effect transistor region (NFET) over the second portion, the NFET including: a plurality of NFET metal fins over the first portion of the substrate, the plurality of NFET fins having a first NFET fin, a second NFET fin adjacent the first fin, and a third NFET fin adjacent the second fin, wherein the first NFET fin is separated from the second NFET by a second distance, and the second NFET fin is separated from the third NFET fin by the second distance, wherein the second distance is distinct from the first distance.

A second aspect of the invention includes a fin-shaped field effect transistor structure (finFET) structure including: a substrate having a first portion and a second portion separated by an isolation region; a p-type field effect transistor region (PFET) over the first portion, the PFET including: a plurality of metal PFET fins over the first portion of the substrate, the plurality of PFET fins having a first PFET fin, a second PFET fin adjacent the first fin, and a third PFET fin adjacent the second fin, wherein the first PFET fin is separated from the second PFET by a first distance, and the second PFET fin is separated from the third PFET fin by a second distance distinct from the first distance; and an n-type field effect transistor region (NFET) over the second portion, the NFET including: a plurality of metal NFET fins over the first portion of the substrate, the plurality of NFET fins having a first NFET fin, a second NFET fin adjacent the first fin, and a third NFET fin adjacent the second fin, wherein the first NFET fin is separated from the second NFET by a third distance, and the second NFET fin is separated from the third NFET fin by a fourth distance distinct from the third distance, wherein each of the plurality of PFET fins has a substantially uniform thickness, and wherein each of the plurality of NFET fins has a substantially uniform thickness.

A third aspect of the invention includes a replacement metal gate (RMG) fin-shaped field effect transistor structure (finFET) structure including: a substrate having a first portion and a second portion separated by an isolation region; at least one of a p-type field effect transistor region (PFET) or an n-type field effect transistor region (NFET) over the first portion, the at least one of the PFET or the NFET including: a plurality of metal fins over the first portion of the substrate, the plurality of fins having a first fin and a second fin adjacent the first fin, wherein each of the first fin and the second fin include a source region and a drain region, wherein the source region of the first fin is separated from the source region of the second fin by a first distance, and the drain region of the first fin is separated from the drain region of the second fin by a second distance distinct from the first distance, wherein the source region has a distinct work function than the drain region based upon the distinction between the first distance and the second distance.

A fourth aspect of the invention includes a method of forming a fin-shaped field effect transistor structure (finFET) structure, the method including: forming a set of non-uniformly spaced metal fins over a substrate, the non-uniformly spaced metal fins including: a first metal fin, a second metal fin separated from the first metal fin by a first distance, and a third metal fin separated from the second metal fin by a second distance distinct from the first distance; depositing a gate metal over the set of non-uniformly spaced metal fins, the gate metal completely filling a space between the first fin and the second fin and only partially filling the space between the second fin and the third fin, leaving a recess between the second fin and the third fin; and depositing a connector metal over the gate metal to substantially fill the recess, wherein the non-uniformly spaced metal fins cause the finFET structure to have distinct work functions.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuits. More particularly, the subject matter relates to fin-shaped field effect transistors, also known as finFETs.

As described herein, one integrated circuit device where shrinking dimensions play a role is the fin-shaped field effect transistor (also referred to as a finFET). The conventional finFET is a three-dimensional transistor structure that includes a set (e.g., one or more) of fin-shaped (relatively thin) source and drain regions overlying a substrate, and at least one (relatively thick) gate overlying the fin(s). The channel region in this finFET spans between the source and drain in the thin fin, beneath the gate. In one particular type of finFET, known as the replacement gate (RG) finFET, the fin (source-drain region) is formed prior to the gate.

It is known in the art that modifying a threshold voltage (Vt) of an integrated circuit device can enhance performance characteristics of that device. Conventional approaches for modifying a threshold voltage in finFET devices, e.g., RG finFETs, involve doping portions of the device, or modifying the length of the channel region. Both of these approaches involve process steps such as masking, lithography and etching, which can complicate fabrication and consume time and resources.

In contrast to conventional approaches, various embodiments include fin-shaped field effect transistors (finFETs) that employ non-uniform spacing between fins, either between adjacent fins or between fins on different portions of the finFET (e.g., n-type FET and p-type FET), to enhance the work function of the finFET. In some embodiments, the work function is varied within the same finFET. In various embodiments, the work function is varied on either side of a fin, e.g., in one or more PFETs and/or NFETS.

As is known in the art, the term "work function" refers to the minimum energy needed to remove an electron from a solid surface (e.g., from its Fermi level into a vacuum). Work function is measured in units of electron-volts (eV). The term "threshold voltage" (Vt) refers to a voltage required to switch a device, e.g., a transistor, from one state to another. The Vt is a voltage level measured in volts. For the purposes of this description, work function and Vt may be used substantially coincidentally to refer to the modification of a switching threshold, either in terms of volts or electron-volts.

Various particular embodiments include a fin-shaped field effect transistor structure (finFET) structure having: a substrate having a first portion and a second portion separated by an isolation region; a p-type field effect transistor region (PFET) over the first portion, the PFET including: a plurality of PFET metal fins over the first portion of the substrate, the plurality of PFET fins having a first PFET fin, a second PFET fin adjacent the first fin, and a third PFET fin adjacent the second fin, wherein the first PFET fin is separated from the second PFET by a first distance, and the second PFET fin is separated from the third PFET fin by the first distance; and an n-type field effect transistor region (NFET) over the second portion, the NFET including: a plurality of NFET metal fins over the first portion of the substrate, the plurality of NFET fins having a first NFET fin, a second NFET fin adjacent the first fin, and a third NFET fin adjacent the second fin, wherein the first NFET fin is separated from the second NFET by a second distance, and the second NFET fin is separated from the third NFET fin by the second distance, wherein the second distance is distinct from the first distance.

Various additional particular embodiments include a fin-shaped field effect transistor structure (finFET) structure including: a substrate having a first portion and a second portion separated by an isolation region; a p-type field effect transistor region (PFET) over the first portion, the PFET including: a plurality of metal PFET fins over the first portion of the substrate, the plurality of PFET fins having a first PFET fin, a second PFET fin adjacent the first fin, and a third PFET fin adjacent the second fin, wherein the first PFET fin is separated from the second PFET by a first distance, and the second PFET fin is separated from the third PFET fin by a second distance distinct from the first distance; and an n-type field effect transistor region (NFET) over the second portion, the NFET including: a plurality of metal NFET fins over the first portion of the substrate, the plurality of NFET fins having a first NFET fin, a second NFET fin adjacent the first fin, and a third NFET fin adjacent the second fin, wherein the first NFET fin is separated from the second NFET by a third distance, and the second NFET fin is separated from the third NFET fin by a fourth distance distinct from the third distance, wherein each of the plurality of PFET fins has a substantially uniform thickness, and wherein each of the plurality of NFET fins has a substantially uniform thickness.

Various further embodiments include a method of forming a fin-shaped field effect transistor structure (finFET) structure, the method including: forming a set of non-uniformly spaced metal fins over a substrate, the non-uniformly spaced metal fins including: a first metal fin, a second metal fin separated from the first metal fin by a first distance, and a third metal fin separated from the second metal fin by a second distance distinct from the first distance; depositing a gate metal over the set of non-uniformly spaced metal fins, the gate metal completely filling a space between the first fin and the second fin and only partially filling the space between the second fin and the third fin, leaving a recess between the second fin and the third fin; and depositing a connector metal over the gate metal to substantially fill the recess, wherein the non-uniformly spaced metal fins cause the finFET structure to have distinct work functions.

Various other embodiments include a replacement metal gate (RMG) fin-shaped field effect transistor structure (fin-FET) structure including: a substrate having a first portion and a second portion separated by an isolation region; at least one of a p-type field effect transistor region (PFET) or an n-type field effect transistor region (NFET) over the first portion, the at least one of the PFET or the NFET including: a plurality of metal fins over the first portion of the substrate, the plurality of fins having a first fin and a second fin adjacent the first fin, wherein each of the first fin and the second fin include a source region and a drain region, wherein the source region of the first fin is separated from the source region of the second fin by a first distance, and the drain region of the first fin is separated from the drain region of the second fin by a second distance distinct from the first distance, wherein the source region has a distinct work function than the drain region based upon the distinction between the first distance and the second distance.

Figure 1:
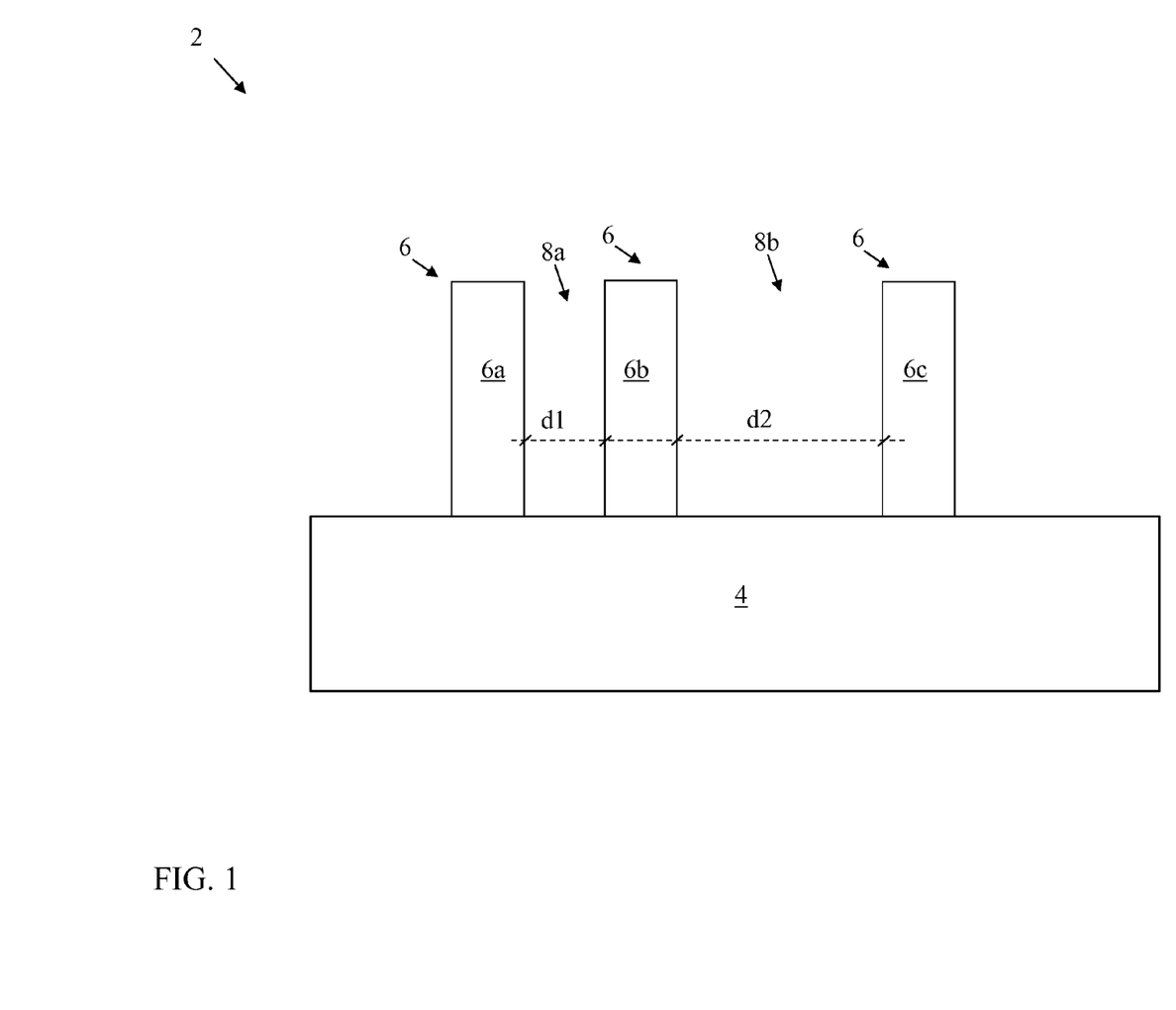
FIG. 1 shows a schematic cross-sectional depiction of a precursor finFET structure according to various embodiments.

Turning to FIG. 1, a cross-sectional schematic view of a portion 2 of a finFET structure is shown according to various embodiments. In some cases, the finFET structure includes a replacement metal gate (RMG) finFET structure, which is formed by fabricating the gate after formation of the fins. As shown, this portion 2 can represent an n-type FET or a p-type FET, which can be formed according to known techniques, e.g., via selective doping or biasing processes known in the art. In either case, a plurality of fins 6 can be formed over the substrate 4. The fins 6 can be formed by conventional deposition, masking and etching processes, e.g., depositing a thick layer of a conductive metal such as tungsten (W), copper (Cu), etc., masking the conductive metal, and etching to form spaces 8a, 8b, etc. between the fins 6. The etching process can expose the substrate region 4 underlying the fins 6.

The fins 6 include a first fin 6a, second fin 6b and third fin 6c. It is understood that any number of fins could be included in this portion 2 of the FET, but for ease of understanding, the example of three fins is used herein.

As shown first fin 6a and second fin 6b can be separated by a first distance d1, while second fin 6b and third fin 6c are separated by a second distance d2. In various embodiments, d2 is greater than d1. In some particular cases, d2 is twice as big as d1.

In some cases, the width of each fin 6a, 6b, 6c is substantially uniform. That is, each of the fins 6a, 6b, 6c can have a substantially equal width.

Figure 2:
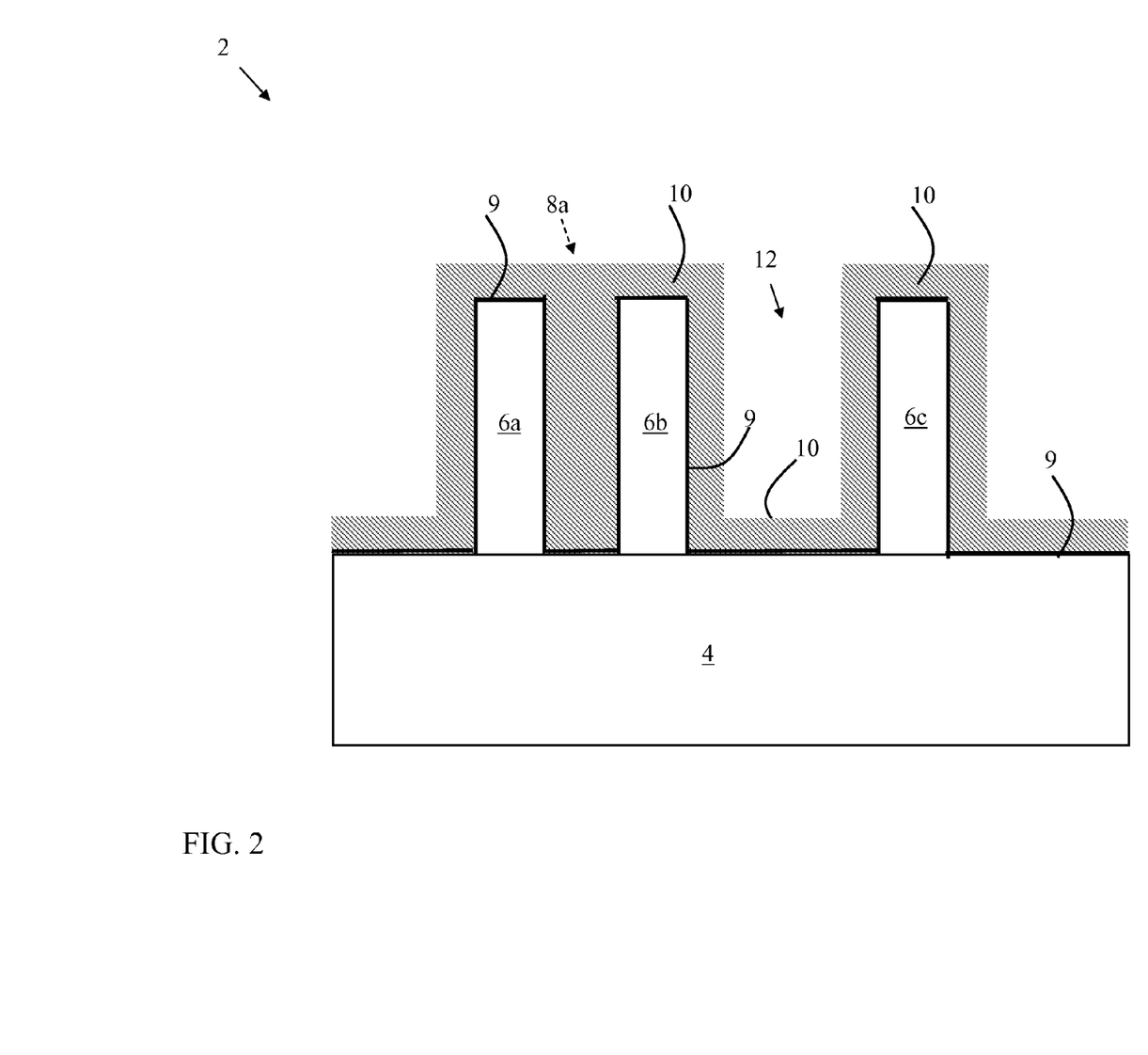
FIG. 2 shows a schematic cross-sectional view illustrating a process of forming a gate metal on the precursor structure of FIG. 1 according to various embodiments.

FIG. 2 shows formation of a gate metal 10 each of the first fin 6a, second fin 6b and third fin 6c. The gate metal 10 can be formed over each of the fins 6 according to known embodiments, e.g., atomic layer deposition (ALD), or other methods such as electroless or electrolytic deposition, sputtering, and/or epitaxial growth. In some embodiments, a gate oxide 9 is formed over the fins 6 prior to formation of the gate metal 10, such that the gate oxide 9 separates the fins 6 from the gate metal 10. The gate oxide 9 can be formed of conventional gate oxide materials, e.g., silicon dioxide $SiO_2$, hafnium dioxide (HfO2) or any other high-k dielectric, and may be formed according to conventional methods. The gate metal 10 can be formed over portions of the substrate 4 (and the gate oxide 9) in some cases, e.g., between second fin 6b and third fin 6c and between first fin 6a and second fin 6b. However, in some alternative embodiments, the gate metal 10 could be formed such that it leaves a portion of the substrate 4 and gate metal 9 exposed, e.g., between the narrower spacing d1 between first fin 6a and second fin 6b. In various embodiments, the gate metal 10 includes tungsten (W), titanium (Ti) and/or titanium nitride (TiN).

Between second fin 6b and third fin 6c, the gate metal 10 leaves a recess (or, trench) 12, which represents a portion of the space between the second fin 6b and third fin 6c not filled by the gate metal 10. In various embodiments the gate metal 10 is formed such that it completely fills the space 8a between the first fin 6a and the second fin 6b, aside from the presence of the gate oxide 9. In some cases, the gate metal 10 only partially fills the space 8b (FIG. 1) between the second fin 6b and the third fin 6c, leaving recess 12.

Figure 3:
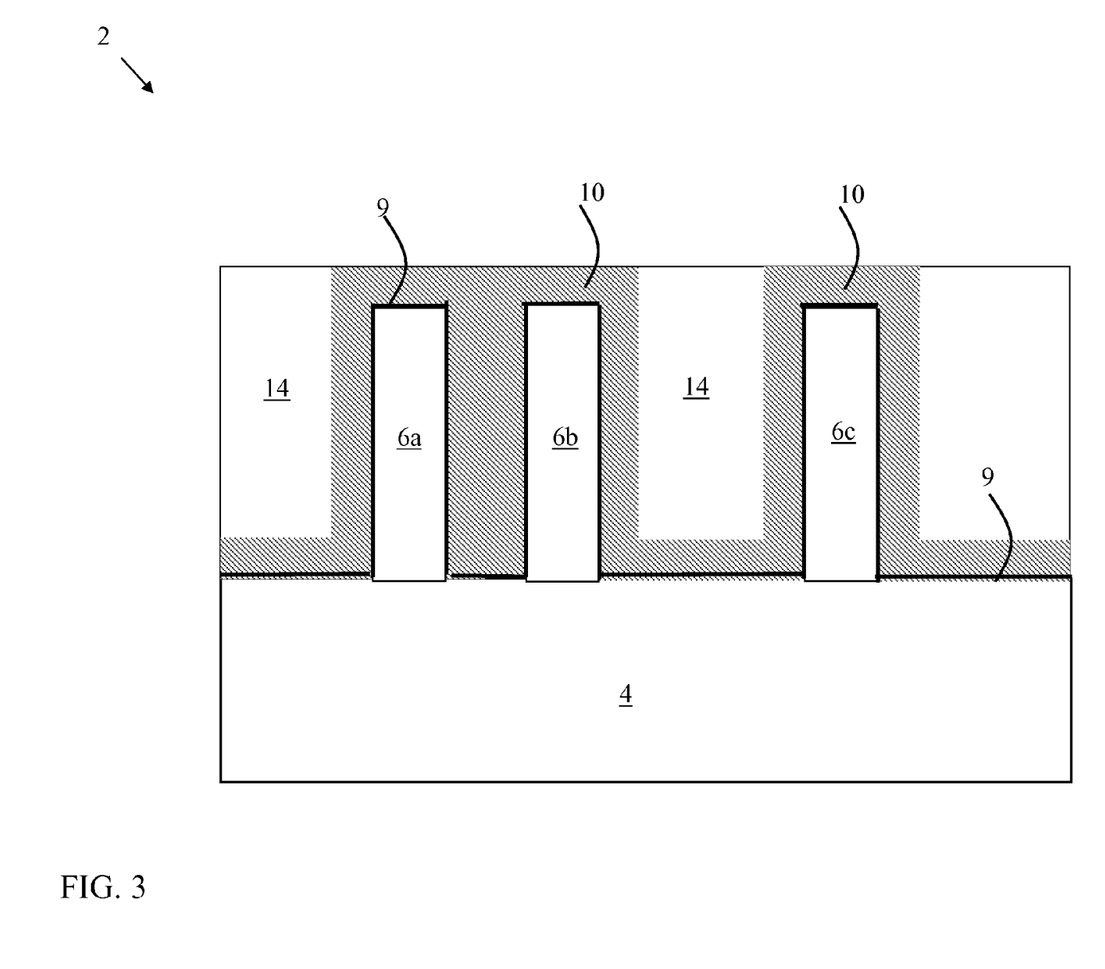
FIG. 3 shows a schematic cross-sectional view illustrating a process of forming a connector metal on the structure of FIG. 2 according to various embodiments.

FIG. 3 shows formation of a connector metal 14 over the gate metal 10 (and over the exposed portion of the substrate 4 between the first fin 6a and the second fin 6b). The connector metal 14 can be deposited over the gate metal 10 to provide a connection point to the gate metal 10 from an overlying device, e.g., a via, interconnect, etc. (not shown). The connector metal 14 can be deposited to fill the recess 12 between the second fin 6b and third fin 6c, and the gap 8a between the first fin 6a and second fin 6b (in the case that the gap 8a is not already filled by the gate metal 10). In some cases, the connector metal 14 includes titanium (Ti) and/or tungsten (W). In various embodiments, the gate metal 14 is formed of a substantially similar metal as the gate metal 10. In various embodiments, the connector metal 14 contributes to the gate work function for the fin 6 (finFET work function), however, in some cases, the connector metal 14 does not significantly affect the fin 6 work function (e.g., the threshold voltage of the finFET).

As shown, the spacing (also known as pitch) between the fins 6 causes a distinct spacing (pitch) between the portions of the gate metal 10 between those fins 6. In turn, this effects the width of the connector metal 14 used to fill the space between the fins 6 not filled by the gate metal 10. In particular embodiments, where the gate metal 10 has a substantially uniform thickness (e.g., due to uniform deposition), the thickness of the connector metal between the fins 6a, 6b, 6c is dictated by the original spacing d1, d2 between the fins 6.

Figure 4:
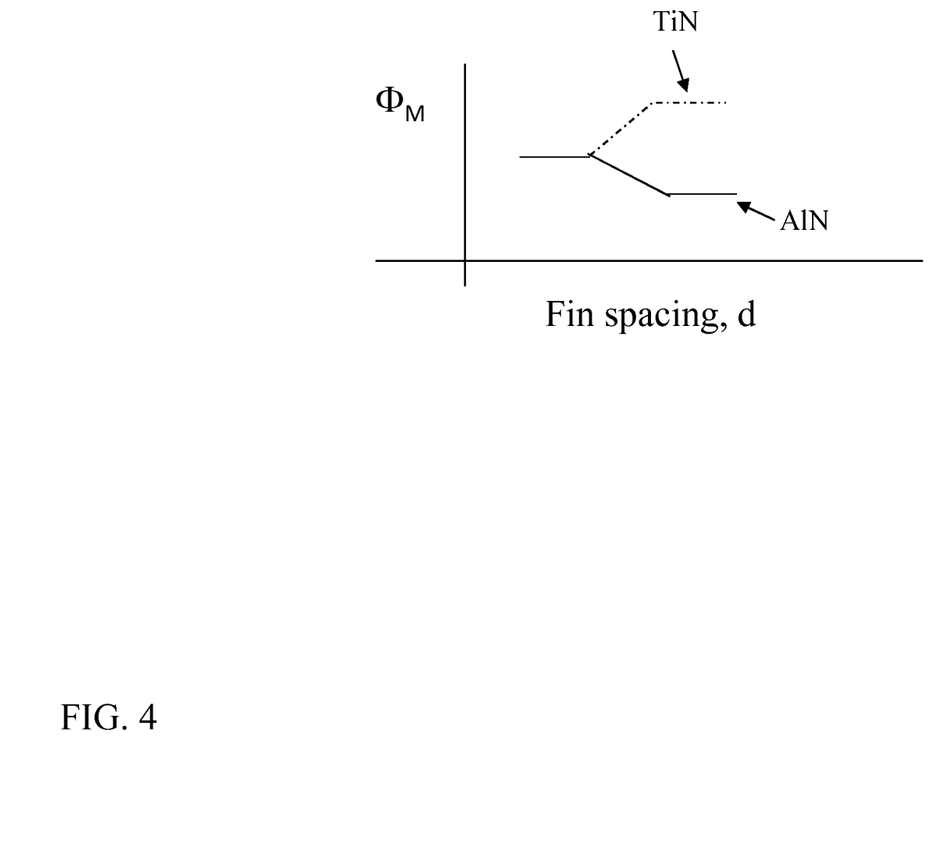
FIG. 4 shows a graphical depiction illustrating the relationship between fin spacing and work function for two metals according to various embodiments.

As described herein, in various embodiments, variation of the spacing of fins (e.g., fins 6) within one or more finFETs allows for modification of the work function in that finFET. The selection of a particular type of gate metal or connector metal can enhance the work function, either increasing or decreasing that function in the FET. FIG. 4 shows a graphical depiction illustrating the relationship between fin spacing (in distance terms, d) and work function for two metals: titanium nitride (TiN) (top plot) and aluminum nitride (AlN) (bottom plot). As shown, where AlN is used as a gate metal an increase in spacing (d) between fins in a finFET can increase the work function (e.g., threshold voltage, Vt) in that FET. Where TiN is used as a connector gate metal, a decrease in spacing (d) between the fins in a finFET can decrease the work function in that finFET.

Figure 5:
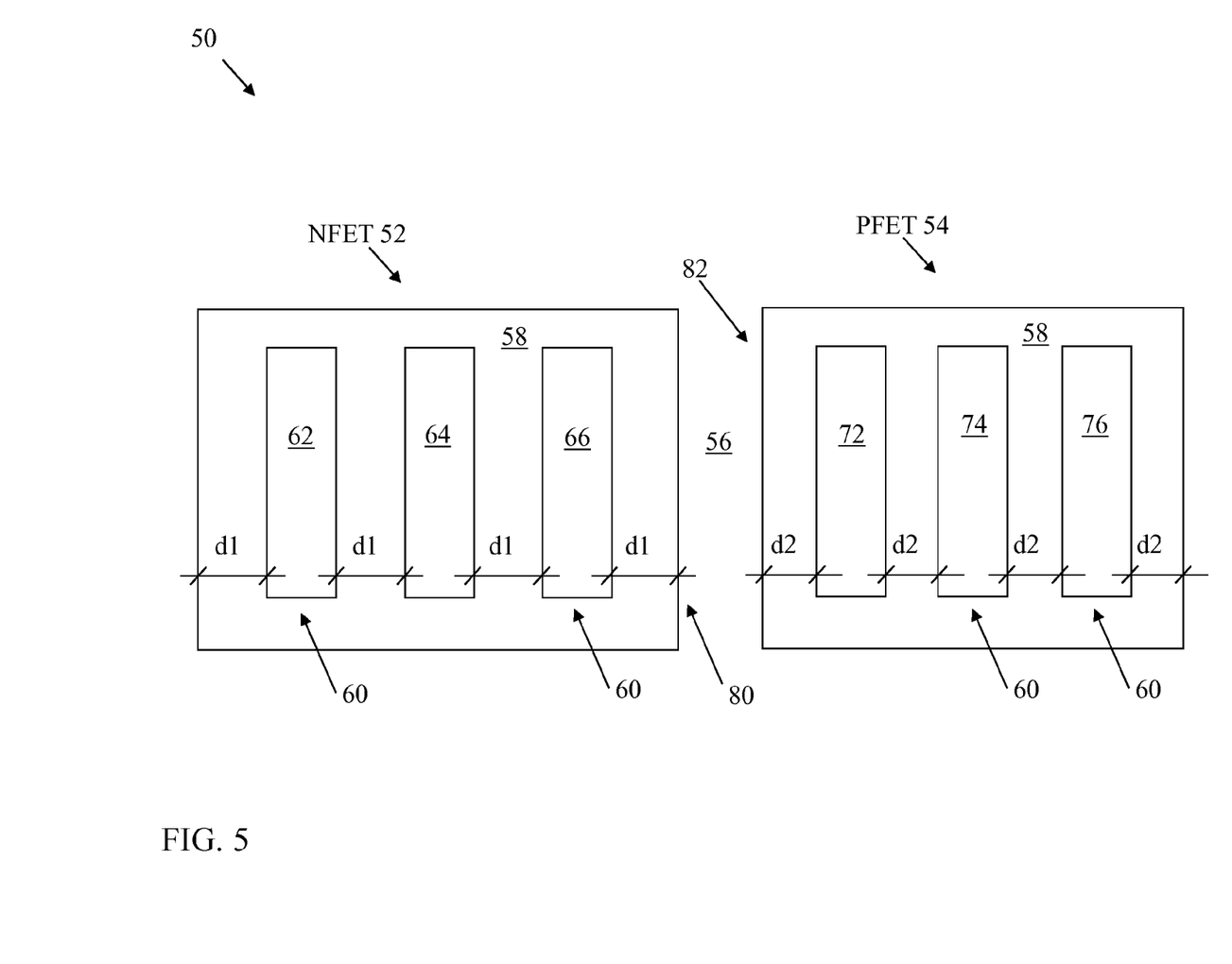
FIG. 5 shows a schematic top depiction of a portion of a replacement metal gate (RMG) finFET structure according to various embodiments.
Figure 6:
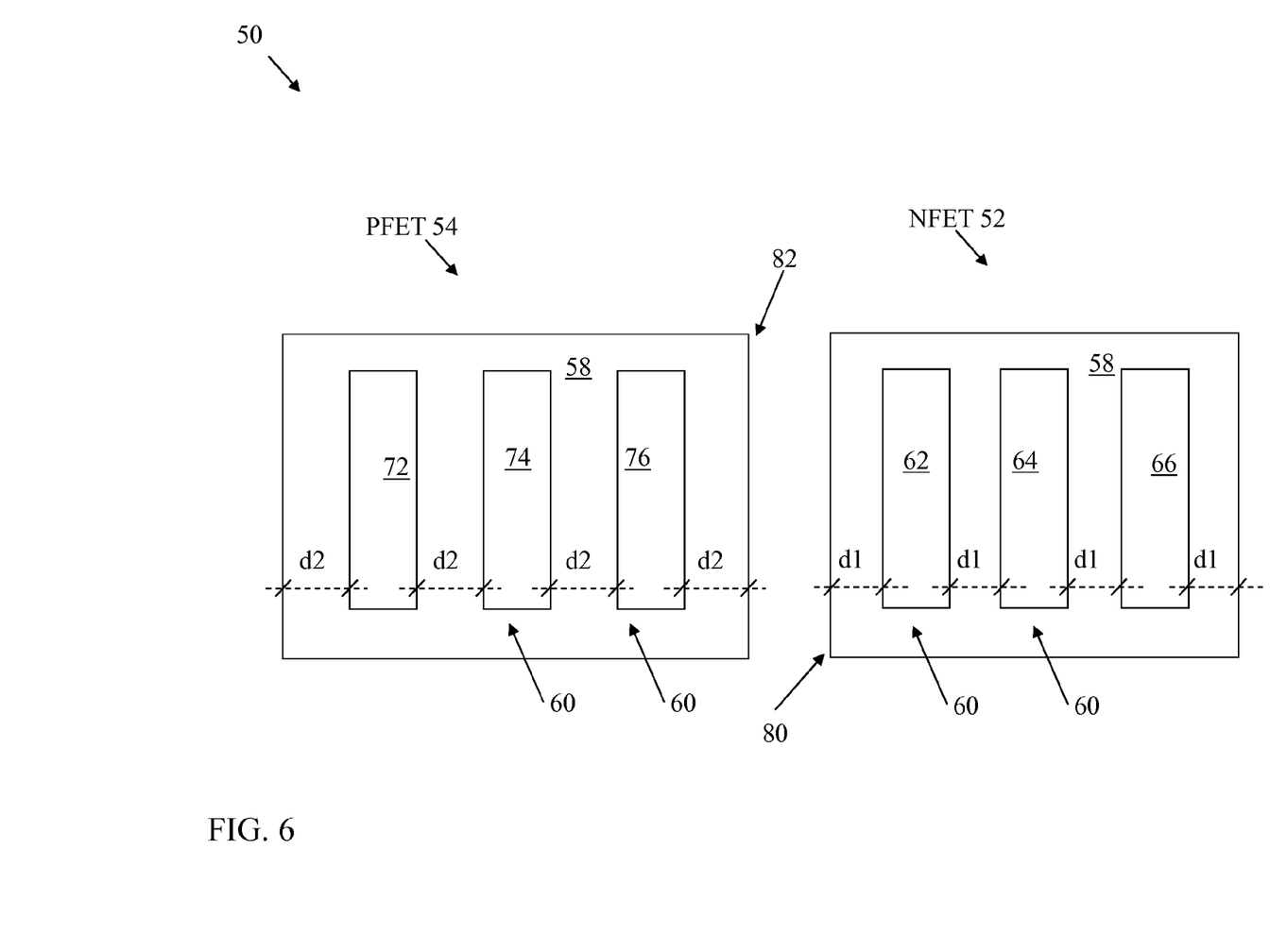
FIG. 6 shows a schematic top depiction of a portion of a replacement metal gate (RMG) finFET structure according to various alternative embodiments.

FIG. 5 shows a schematic top depiction of a portion of an RMG finFET structure 50 having an NFET region 52 and a PFET region 54, separated by an isolation region 56. The isolation region 56 can include a non-conductive region, which may be a doped region of a substrate 58. In some embodiments, as shown in FIG. 5, the NFET region 52 and the PFET region 54 each include a plurality of fins 60, where the fins 60 may include three-dimensional metal protrusions extending from the top surface of the substrate 58. The NFET region 52 can include a first fin 62, a second fin 64, and a third fin 66. The PFET region 54 can include a first fin 72, a second fin 74 and a third fin 76. In various embodiments, the first fin 62, second fin 64 and third fin 66 of the NFET region 52 are equally spaced apart, at a first distance d1 from one another (and an edge 80 of the isolation region 56). In these embodiments, the first fin 72, second fin 74 and third fin 76 of the PFET region 54 are equally spaced apart, at a second distance d2 from one another (and a second edge 82 of the isolation region 56). In these embodiments, the first distance d1 is distinct from the second distance d2. In particular cases, as shown in FIG. 5, d1 is greater than d2. In alternative embodiments, as shown in FIG. 6, d2 is greater than d1.

Figure 7:
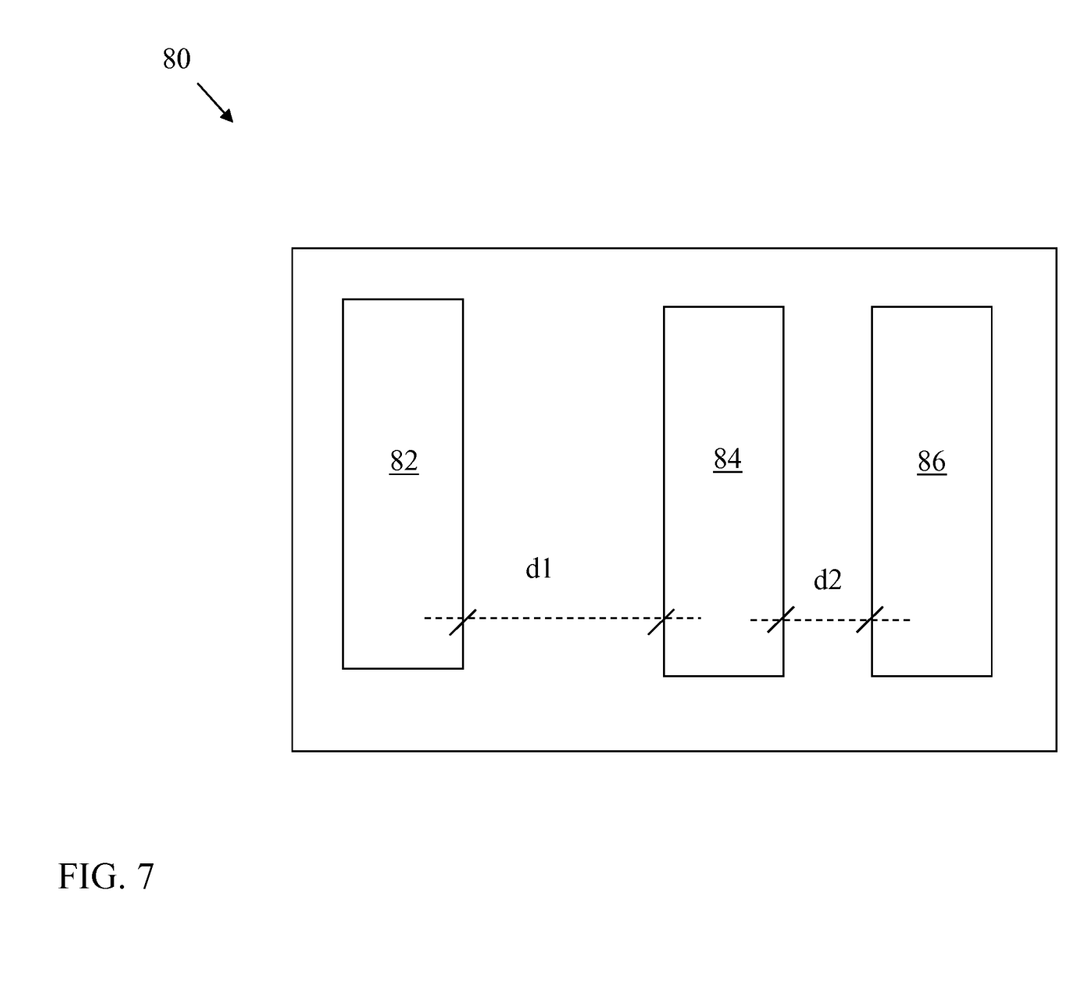
FIG. 7 shows a schematic top depiction of a portion of a replacement metal gate (RMG) finFET structure according to various alternative embodiments.

FIG. 7 shows an alternative embodiment of a portion of a finFET 80, e.g., an NFET or a PFET, that has distinct spacing d1 between a first fin 82 and a second fin 84, than a spacing d2 between the second fin 84 and a third fin 86. As shown, this distinction in spacing d1, d2 is within the same finFET 80, e.g., the same NFET or PFET. This allows for different work functions between distinct fins 82, 84, 86 in the finFET 80. In some cases, these distinct work functions can be achieved using the same gate metal and/or connector metal overlying distinct fins 82, 84, 86 in the FET 80.

Figure 8:
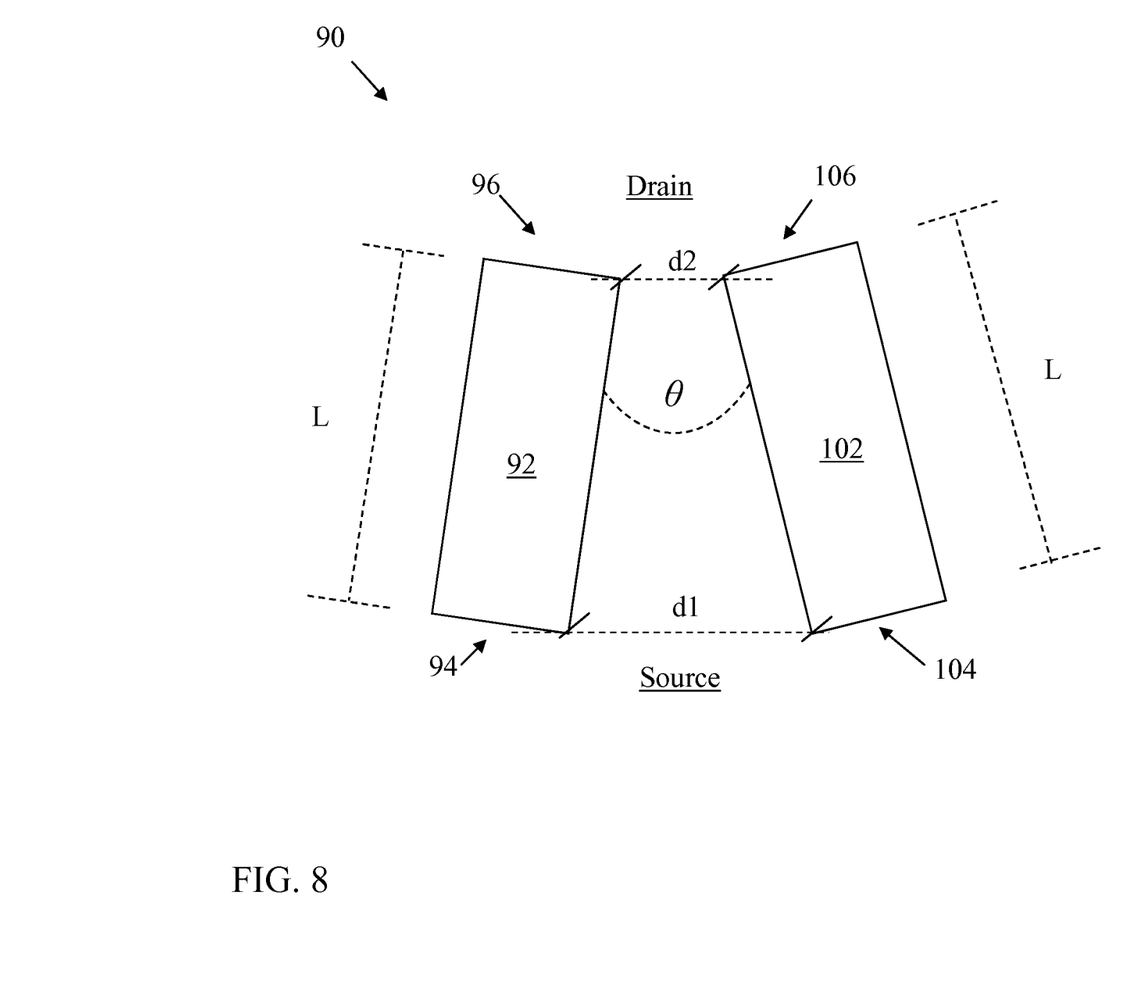
FIG. 8 shows a schematic top depiction of a portion of a replacement metal gate (RMG) finFET structure according to various embodiments.

FIG. 8 shows another alternative embodiment of a portion of a finFET 90, e.g., an NFET or a PFET, that has two fins, a first fin 92 and a second fin 102 adjacent the first fin 92. The first fin 92 has a source region 94 and a drain region 96. The second fin 102 has a source region 104 and a drain region 106. As with other finFET structures shown and described herein and known in the art, the source regions 94, 104 and drain regions 96, 106 of the adjacent fins 92, 102 are aligned such that the source regions 94, 104 are immediately adjacent one another and the drain regions 96, 106 are immediately adjacent one another.

In some embodiments, where fins in the finFET are angled with respect to one another, e.g., the fins are non-parallel, an angle (θ) between adjacent fins can be defined according to the following formula:

$$\theta = 2\sin^{-1}\frac{\Delta D}{2L} \quad \text{(Equation 1)}$$

Where: θ=the angle between the adjacent fins; ΔD=d1−d2 (difference between distances from source regions and drain regions, respectively, of adjacent fins); and L=the design length of the fins (where both fins have the same length).

In these alternative embodiments, the source regions 94, 104 can be separated by a first distance d1, while the drain regions 96, 106 are separated by a second distance d2 distinct from the first distance d1. In various embodiments, the first distance d1 is greater than the second distance d2. A finFET with a different distance (pitch) between adjacent source and drain regions allows for distinct gate thicknesses between the source and drain regions in the finFET. The distinct gate thickness at the source and drain is directly linked to a distinct work function at the source and drain regions. In particular cases, having a higher work function near the source regions 94, 104 (and a relatively lower work function near the drain regions 96, 106), can allow for improved performance in the finFET.

Other embodiments of the invention can include a method of forming a finFET structure, e.g., an RMG finFET structure including one or more of the structures shown and described with reference to FIGS. 1-7. In some cases, at least a portion of the method(s) could be used to form the finFET structures shown in any embodiments herein. In some cases, the process can include:

Process P1: providing a substrate having a first portion and a second portion separated by an isolation region.

Process P2A: forming a set of non-uniformly spaced metal fins over one of the first portion or the second portion. In various embodiments, this can include doping the first or second region with p-type or n-type dopants to form a p-type region or an n-type region. In some cases, the process can include doping the set of metal fins after forming the fins over the first portion or the second portion. Process P2 can include forming the metal fins such that a distance between a first fin and a second fin is distinct from a distance between the second fin and a third fin within one of an NFET or a PFET region. In various embodiments, forming metal fins with non-uniform distances, e.g., as in non-uniform between the NFET and PFET, or within one or more NFETs or PFETs, can allow for modification of a work function (e.g., threshold voltage Vt) of one or more finFET structures without needing additional masking and etching steps as in the prior art. Further, some additional doping steps used to modify threshold voltage (Vt) in conventional finFETs can be avoided when forming the finFET devices shown and described herein.

Process P3: following process P2, Process P3 can include forming a gate metal over the set of metal fins between the first fin and the second fin, and the second fin and the third fin. In some cases, the forming of the gate metal can include depositing the gate metal to completely fill the space between the first and second fins, and only partially fill the space between the second and third fins. This leaves a recess between the second and third fins.

Process P4: forming a connecting metal over the metal gate. In some cases, the connecting metal is deposited to fill the recess between the second and third fins. As described herein, the non-uniform spacing of the fins in the finFET can cause the finFET to have distinct work functions, e.g., distinct threshold voltages (Vt). That is, the finFET can have a distinct Vt through the first fin (first gate) than through the second fin (second gate) or third fin (third gate) due to the non-uniform spacing of the fins.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A fin-shaped field effect transistor structure (finFET) structure comprising:
   a substrate having a first portion and a second portion separated by an isolation region;
   a p-type field effect transistor region (PFET) over the first portion, the PFET including:
      a plurality of PFET metal fins having a first PFET fin, a second PFET fin adjacent the first fin, and a third PFET fin adjacent the second fin, wherein the first PFET fin is separated from the second PFET by a first distance, and the second PFET fin is separated from the third PFET fin by the first distance; and
   an n-type field effect transistor region (NFET) over the second portion, the NFET including:
      a plurality of NFET metal fins having a first NFET fin, a second NFET fin adjacent the first fin, and a third NFET fin adjacent the second fin, wherein the first NFET fin is separated from the second NFET by a second distance, and the second NFET fin is separated from the third NFET fin by the second distance, wherein the second distance is distinct from the first distance.

2. The structure of claim 1, further comprising:
   a gate metal over the plurality of PFET fins and the plurality of NFET fins, the gate metal spanning the first distance between the plurality of PFET fins and the second distance between the plurality of NFET fins,
   wherein the first distance and the second distance cause the gate metal to have a distinct pitch in the PFET than a pitch in the NFET.

3. The structure of claim 2, wherein the distinct pitch in the PFET and the NFET causes the PFET to have a distinct work function from a work function in the NFET.

4. The structure of claim 2, wherein the gate metal does not fill the first distance and does not fill the second distance, the gate metal leaving a first recess between the first PFET fin and the second PFET fin, and a second recess between the first NFET fin and the second NFET fin, the first recess having a distinct width from the second recess.

5. The structure of claim 4, further comprising:
   a connector metal over the gate metal, the connector metal filling the first recess and the second recess, the connector metal having a first width between the first PFET fin and the second PFET fin and a second width between the first NFET fin and the second NFET fin, wherein the first width of the connector metal is distinct from the second width of the connector metal.

6. The structure of claim 4, further comprising a gate oxide layer between the gate metal and each of the plurality of PFET fins and the plurality of NFET fins.

7. The structure of claim 1, wherein the first distance is greater than the second distance.

8. The structure of claim 1, wherein the second distance is greater than the first distance.

9. The structure of claim 1, wherein each of the plurality of PFET fins and the plurality of NFET fins have a substantially uniform thickness.

10. A fin-shaped field effect transistor structure (finFET) structure comprising:
    a substrate having a first portion and a second portion separated by an isolation region;
    a p-type field effect transistor region (PFET) over the first portion, the PFET including:
       a plurality of metal PFET fins having a first PFET fin, a second PFET fin adjacent the first fin, and a third PFET fin adjacent the second fin, wherein the first PFET fin is separated from the second PFET by a first distance, and the second PFET fin is separated from the third PFET fin by a second distance distinct from the first distance; and
    an n-type field effect transistor region (NFET) over the second portion, the NFET including:
       a plurality of metal NFET fins having a first NFET fin, a second NFET fin adjacent the first fin, and a third NFET fin adjacent the second fin, wherein the first NFET fin is separated from the second NFET by a third distance, and the second NFET fin is separated from the third NFET fin by a fourth distance distinct from the third distance,
    wherein each of the plurality of PFET fins has a substantially uniform thickness, and wherein each of the plurality of NFET fins has a substantially uniform thickness.

11. The structure of claim 10, further comprising:
    a gate metal over the plurality of PFET fins, the gate metal spanning the first distance between the first PFET fin and the second PFET fin and the second distance between the second PFET fin and the third PFET fin,
    wherein the first distance and the second distance cause the gate metal to have a distinct pitch between the first PFET fin and the second PFET fin and the second PFET fin and the third PFET fin.

12. The structure of claim 11, wherein the distinct pitches in the PFET cause the PFET to have two distinct work functions.

13. The structure of claim 11, wherein the gate metal does not fill the first distance and does not fill the second distance, the gate metal leaving a first recess between the first PFET fin and the second PFET fin, and a second recess between the second PFET fin and the third PFET fin, the first recess having a distinct width from the second recess.

14. The structure of claim 13, further comprising:
    a connector metal over the gate metal, the connector metal filling the first recess and the second recess, the connector metal having a first width between the first PFET fin and the second PFET fin and a second width between the second PFET fin and the third PFET fin, wherein the first width of the connector metal is distinct from the second width of the connector metal.

15. The structure of claim 13, further comprising a gate oxide layer between the gate metal and each of the plurality of PFET fins and the plurality of NFET fins.

16. The structure of claim 10, further comprising:
    a gate metal over the plurality of NFET fins, the gate metal spanning the third distance between the first NFET fin and the second NFET fin and the fourth distance between the second NFET fin and the third NFET fin,
    wherein the first distance and the second distance cause the gate metal to have a distinct pitch between the first NFET fin and the second NFET fin and the second NFET fin and the third NFET fin.

17. The structure of claim 16, wherein the distinct pitches in the NFET cause the NFET to have two distinct work functions.

18. The structure of claim 10, wherein at least one of the first distance, the second distance, the third distance or the fourth distance includes a non-uniform distance including a distinct pitch between a source region of two adjacent fins and a drain region of the two adjacent fins.

* * * * *